Jan. 21, 1958 C. E. COY ET AL 2,820,930

TRANSISTOR HOLDERS

Filed Oct. 11, 1955

*INVENTORS:*
CARL E. COY
BYRL D. TAGUE
*BY* A. W. O'Brien
H. H. Losche
ATTYS.

2,820,930

TRANSISTOR HOLDERS

Carl E. Coy, Glen Burnie, Md., and Byrl D. Tague, Indianapolis, Ind., assignors to the United States of America as represented by the Secretary of the Navy Application October 11, 1955, Serial No. 539,954
3 Claims. (Cl. 317—234)
(Granted under Title 35, U. S. Code (1952), sec. 266)

The invention described herein may be manufactured and used by or for the Government of the United States of America for governmental purposes without the payment of any royalties thereon or therefor.

The present invention relates to a holding bracket for electronic components and more particularly to a bracket for mounting hermetic enclosure type transistors.

Heretofore transistors and other small electronic components have not been fastened mechanically to chassis or terminal boards, and the electrical connections to the component leads were used for holding and supporting the component. This method of mounting is highly undesirable in that vibration and shocks move the components relative to the chassis or terminal board causing microphonics and often causing the connections to break.

The present invention provides a novel method of mechanically connecting a transistor of the hermetic enclosure type to a chassis or terminal board. The peculiar round or oval shape of this type transistor has made it difficult to devise holding brackets, and heretofore these types of transistors have only been held in position by the electrical connections thereon. The present invention provides an inexpensive holding device that permits a transistor to be rapidly mounted or dismounted even without unsoldering of electrical connections. The novel device consists of a U-shaped bracket that is slotted longitudinally thereby forming a top and bottom leaf, the top leaf being of suitable thickness to permit cantilever bending. The transistor flange is mounted in the longitudinal slot and the top leaf is sprung against this transistor flange to rigidly clamp the transistor in position.

It is therefore a general object of the present invention to provide an inexpensive transistor holder that will permit rapid mounting or removal of the transistor.

Other objects and many of the attendant advantages of this invention will be readily appreciated as the same becomes better understood by reference to the following detailed description when considered in connection with the accompanying drawing wherein.

Figure 1:
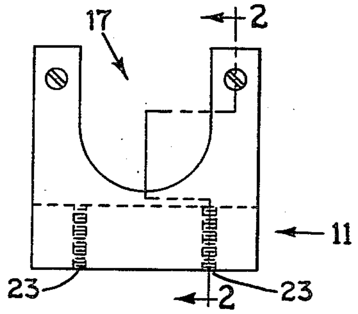
Fig. 1 is a top plan view of a preferred embodiment of the invention.
Figure 2:
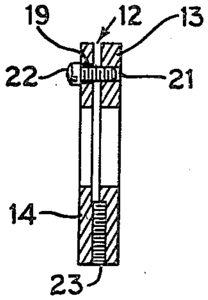
Fig. 2 is a sectional view taken on line 2—2 of Fig. 1.

Referring now to the drawing, wherein like reference characters designate like or corresponding parts throughout the several views, there is shown in Figs. 1 and 2 a U-shaped bracket 11 having a longitudinal slot 12 which forms a bottom leaf 13 and a top leaf 14. The top leaf 14 is substantially narrow in thickness so that it may be bent in cantilever fashion.

Figure 3:
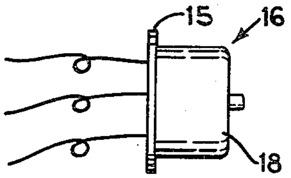
Fig. 3 is a side view of a hermetic seal type transistor of the kind and shape to be mounted.

The width of the longitudinal slot 12 is such that the flange 15 of the transistor 16, as shown in Fig. 3, readily slides therein. Also the opening 17 of the U-shaped bracket 11 is of sufficient width such that the body portion 18 of the transistor 16, will pass therethrough, but the flange 15 will not pass.

The top leaf 14 has a pair of clearance holes 19 and a pair of tapped holes 21 are in the bottom leaf 13 and in alignment with the clearance holes 19. Screws 22 are passed through the clearance holes 19 and threaded into the tapped holes 21 and on tightening of the screws 22, the top leaf 14 will be bent in cantilever fashion, thus clamping the transistor 16 in position.

Figure 4:
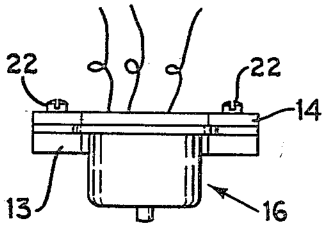
Fig. 4 is an end view showing the transistor shown in Fig. 3 mounted in the preferred embodiment of the invention.

In Fig. 4 of the drawing there is shown a transistor 16 mounted in the U-shaped bracket 11, and it can be seen that a transistor can be inserted or removed therefrom without having to unhook any electrical connections. Only the two screws 22 have to be loosened, and the transistor can be readily removed.

The U-shaped bracket 11 has two additional tapped holes 23 in the end opposite the longitudinal slot 12, that permit the bracket to be fastened to a chassis or terminal board.

Figure 5:
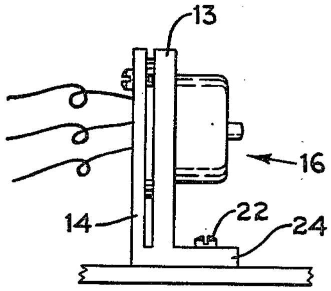
Fig. 5 is a side view of another embodiment of the invention, showing a transistor mounted thereon.

In Fig. 5 of the drawing there is shown a modification of the preferred embodiment wherein an extended flange 24 is added which permits the screws 22 to be threaded into a chassis or terminal board. This modification would have application when it is desirable to have no protrusions on the bottom side of the chassis.

Figure 6:
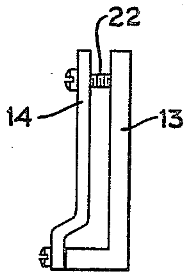
Fig. 6 is a side view of still another embodiment.

In Fig. 6 of the drawing another modification is shown wherein the top leaf 14 is made as a separate piece and screwed or riveted to the bottom leaf 13. This type of construction permits the top leaf 14 to be made from material having good flexure properties, such as Phosphor bronze, spring steel, or other spring material.

Obviously many modifications and variations of the present invention are possible in the light of the above teachings. It is therefore to be understood that the invention may be practiced otherwise than as specifically described.

What is claimed is:

1. A holder for a transistor of the hermetic enclosure type having a flange thereon comprising; a bottom U-shaped leaf, a top U-shaped leaf spaced apart and attached to said bottom leaf in cantilever fashion, said bottom leaf being substantially thicker than said top leaf, and adjustable means for bending said top leaf towards said bottom leaf whereby a flange on a transistor to be held is removably clamped between said top and bottom leaves.

2. A holder for a transistor of the hermetic enclosure type having a flange thereon comprising; a U-shaped body having a longitudinal slot thereby forming a top and a bottom leaf, said bottom leaf being substantially thicker than said top leaf, and adjustable means for bending said top leaf towards said bottom leaf whereby a flange on a transistor to be held is removably clamped between said top and bottom leaves.

3. A holder for a transistor of the hermetic enclosure type having a flange thereon comprising; a bottom leaf, a top leaf of thin flexible material spaced apart and attached to said bottom leaf, each said top and bottom leaf having an opening on one side whereby the body of a transistor to be mounted may be passed therethrough, and adjustable means for bending said top leaf of thin flexible material towards said bottom leaf whereby a flange on said transistor to be mounted is removably clamped between said top and bottom leaves.

References Cited in the file of this patent

UNITED STATES PATENTS 2,309,081 Priessman et al. ---------- Jan. 26, 1943